CROSS REFERENCE EXAMINER

HF $Na_2Cr_2O_7$ (acetic acid)

United States Patent Office 2,871,110
Patented Jan. 27, 1959

2,871,110

ETCHING OF SEMICONDUCTOR MATERIALS

Richard R. Stead, Richardson, Tex., assignor to Texas Instruments Incorporated, Dallas, Tex., a corporation of Delaware No Drawing. Application July 26, 1956
Serial No. 600,162

12 Claims. (Cl. 41—42)

This invention relates to the etching of surfaces of semiconductor materials, such as germanium and silicon, in the course of preparing them for use in electrical semiconductor devices, such as diodes and transistors, and to an etching solution particularly adapted for this use.

Almost all semiconductor diodes, transistors and other such devices utilize very small blocks or bars of monocrystalline semiconductor material to which are affixed two or more electrical connections. To achieve a workable device, the bars or blocks must be treated in some fashion before the leads are attached to remove any foreign materials or contaminants from their surfaces and also to remove any crystal lattice defects on their surfaces. Such crystal lattice defects are caused by the cutting and sawing operations necessary to cut large single crystals of semiconductor material into bars and blocks of the proper size for use in semiconductor devices. Further, after the leads have been attached to the treated bars such as by alloying or electrical bonding, it is desirable to "clean" the connections by removing material not completely alloyed or bonded from around the connection since this material may bridge the connection and cause shorting.

Both of these cleaning steps are usually accomplished by subjecting the bars or blocks to an acid etching treatment. Probably the most widely used etching solution in the prior art comprises hydrofluoric acid, nitric acid, acetic acid and a small amount of bromine. This etching solution has become generally known and is referred to as CP–4.

In accordance with this invention, it has been discovered that the cleaning step may be accomplished much more expediently by the use of improved etching solutions of new composition, these solutions being composed of nitric acid, hydrofluoric acid and sodium dichromate. In experiments using these improved etching solutions, it has been found that the solutions are far more stable than the standard CP–4 solution and etching is subject to better control without pitting of the surface of the semiconductor material. Moreover, a faster etching takes place with the resultant surface of the semiconductor element much improved over elements etched in the standard solution. However, it has also been found that the addition of acetic acid to the above formulation controllably reduces the rate at which etching takes place while the etching effectiveness of the solution is still maintained. Further, germanium units of various types and silicon n–p–n units etched in the solutions of this invention showed improved $I_{co}$, Z and $\beta$ characteristics over similar units etched in the standard solution. As is well known to those skilled in the art, these symbols designate, in general, the characteristics of reverse polarity current, collector voltage breakdown and small signal current amplification factor respectively of a transistor. Additionally, the use of these improved etching solutions provides an improved, chemically polished surface upon which it is much easier for the observer to locate the junction between the materials of two different types of conductivity and thus the point at which a lead or leads must be attached.

Accordingly, an object of this invention is to provide an improved process for the preparation of the surfaces of semiconductor materials used in electrical semiconductor devices by etching the surfaces in a solution comprised of hydrofluoric acid, nitric acid and sodium dichromate.

A further object of this invention is to provide improved etching solutions which comprise hydrofluoric acid, nitric acid and sodium dichromate.

A still further object of this invention is to reduce controllably the rate of etching of solutions comprising hydrofluoric acid, nitric acid and sodium dichromate by the addition of acetic acid to the solutions.

According to this invention, electrical semiconductors, such as silicon and germanium, can be chemically polished under controlled conditions to produce improved characteristics and finish by the use of an etching solution which consists of about 30 to 50 parts by volume of concentrated nitric acid, about 20 to 30 parts by volume of 48% hydrofluoric acid and about 0.5 to 21 parts by volume of 0.05 to 10% aqueous sodium dichromate. Changes in the proportion of sodium dichromate in the solution tend to vary the speed at which the etching takes place with faster etching rates occurring at the higher concentration of sodium dichromate as will be illustrated below. It will also be demonstrated that the addition of acetic acid to this solution slows down the rate of etching thereby effecting a means of etch rate control. For example, the addition of 5 parts by volume of glacial acetic acid to a basic formula etch (e. g. 30 parts by volume of concentrated nitric acid, 20 parts by volume of 48% hydrofluoric acid and 1 part by volume of 1% aqueous sodium dichromate) slows the etch rate by from 0.5 to 2.0 mils per minute. The etching solution of this invention performs well at room temperatures, but may be used at somewhat below room temperatures without losing its effectiveness.

It is obvious that a lesser amount of more concentrated hydrofluoric acid may replace the amounts of 48% hydrofluoric acid specified without losing the effectiveness of the etching solution. However, in such cases it will be found desirable to add a sufficient amount of distilled water to bring the total concentration in line with those that will result from the mixing of the reagents specified in the concentrations and proportions as set forth above.

The following examples will indicate to those skilled in the art the superior qualities of the improved etching solutions disclosed above. In each of the examples, etching was accomplished by totally immersing the samples in the etching solution for a short period of time after which they were removed and washed with distilled water.

EXAMPLE I

The etching solution used contained 30 parts by volume of concentrated nitric acid, 20 parts by volume of 48% hydrofluoric acid and 1 part by volume of 1% aqueous sodium dichromate. Surface material was removed from a ground and lapped silicon slice at the rate of about 9 to 10 mils per minute by this solution and a mirror-smooth surface resulted. N–p–n silicon bars emerged from an initial etch in this solution, i. e., the first etching treatment after the bars have been cut out of the parent crystal, with a slightly uneven mirror-surface. N–p–n germanium bars emerged from an initial etch in this solution with shiny, relatively rough surfaces and a groove at the p-layer indicating that p–type germanium is etched at a faster rate by this solution than is n-type germanium.

EXAMPLE II

The etching solution used contained 30 parts by volume of concentrated nitric acid, 20 parts by volume of 48% hydrofluoric acid, 30 parts by volume of glacial acetic acid and 1 part by volume of 1% aqueous sodium dichromate. Used as an initial etch on a silicon slice, this solution removed about 2 mils per minute and produced a smooth mirror surface and sharp corners and edges. Used on n-p-n silicon bars, this solution produced good definition of the emitter (emitter smooth and shiny, collector dull and rougher) with a slight "step" at the p-layer after 25 seconds. On n-p-n germanium bars, the reaction of this etch was rather slow but produced a mirror-smooth surface. Used as a second etch (final etch after leads are attached, but before unit is canned) on silicon diodes, this etch produced definite improvements in the electrical properties (Zener voltage, forward current and the like) over the CP–4 etch and as the initial etch, it greatly aided the attachment of lead wires to silicon devices.

EXAMPLE III

A comparison test was conducted on two groups of p-n junction silicon wafers cut from the same crystal. Group 1 was etched in a standard CP–4 solution without bromine. Group 2 was etched in a solution of 30 parts by volume of concentrated nitric acid, 20 parts by volume of 48% hydrofluoric acid, 30 parts by volume of glacial acetic acid and 1 part by volume of 1% aqueous sodium dichromate. After 1000 hours shelf aging at 150° C., forward and reverse current for the samples from each group were compared with the following results:

| Reverse Current at 10 Volts | Group 1 Wafers (17 samples) | Group 2 Wafers (14 samples) |
|---|---|---|
| Less than 0.00001 microamps | 2 (11.8%) | 1 (7.15%) |
| 0.00001–0.0001 microamps | 5 (29.4%) | 7 (50%) |
| 0.0001–0.001 microamps | 5 (29.4%) | 5 (35.7%) |
| 0.001–0.01 microamps | 3 (17.6%) | 1 (7.15%) |
| 0.01–0.1 microamps | 2 (11.8%) | 0 |

All of the samples of group 1 required from 0.772 to 0.81 volts forward voltage to produce a 10 milliampere current flow. All of the samples of group 2 required from 0.79 to 0.84 volts forward voltage to produce the same 10 milliampere current flow.

EXAMPLE IV

The etching solution used contained 30 parts by volume of concentrated nitric acid, 20 parts by volume of 48% hydrofluoric acid, 5 parts by volume of glacial acetic acid, and 1 part by volume of 1% aqueous sodium dichromate. A comparison test was conducted between this etching solution and a production etching solution, designated as CP–6, containing 120 ml. of glacial acetic acid, 160 ml. of 48% hydrofluoric acid, 200 ml. of concentrated nitric acid, and 40 drops of bromine. The CP–6 etch differs from the standard CP–4 etch only in that it contains a 33% greater concentration of hydrofluoric acid. The tests were conducted on n-p-n silicon bars cut from crystals grown to produce a specific type of transistor. Acceptable transistors of this type are designated grade A, superior and grade B, good. All characteristics of these two grades of this type of transistor are identical except for the following:

| | Min. | Design Center | Max. |
|---|---|---|---|
| Current Transfer Ratio: | | | |
| Grade A | −0.95 | −0.96 | −0.975 |
| Grade B | −0.90 | −0.925 | −0.950 |
| Power Gain, Common Emitter: | | | |
| Grade A ___ db | | 34.0 | |
| Grade B ___ db | | 30.5 | |
| Frequency Cutoff: | | | |
| Grade A ___ mc | | 5 | |
| Grade B ___ mc | | 4 | |

Pre-can tests of transistors made from group 1 bars, etched in CP–6, showed a yield ratio of grade A transistors to grade B transistors of 1 to 3, the usual production average using prior art etching solution. Pre-can tests of transistors made from group 2 bars, etched in the solution noted above, showed a yield ratio of grade A transistors to grade B transistors of 1 to 1, a substantial improvement. The total yield for acceptable transistors, grade A and grade B, from group 1 and group 2 was about the same. Little difference was noted in $I_{co}$ of the two groups of transistors. However, the Zener voltage and $\beta$ characteristics of the group 2 samples were much higher than those of the group 1 samples. On final tests, after cycling and aging, 51.7% of the dichromate etched samples, group 2, proved acceptable as compared to a usual production average of from 40 to 45% of acceptable units etched in other types of solutions, including the CP–6 solution used in this test.

The following table outlines the etching properties of the improved etching solutions of the present invention with the proportions of reagents indicated. This table includes the etching solutions illustrated in the above four examples.

*Table I*

SODIUM DICHROMATE ETCH SOLUTION

| Composition | Etch Rate (mils/60 sec.) | Comments |
|---|---|---|
| (1) 21 cc. 0.05% $Na_2Cr_2O_7$; 30 cc. $HNO_3$; 20 cc. HF | ------- | On n-p-n Silicon Bars: Dull, rough surface, Sharp step at "P" layer after 70 seconds. |
| (2) 10 cc. 0.1% $Na_2Cr_2O_7$; 40 cc. $HNO_3$; 20 cc. HF | 5.0 | On Silicon Wafers: Shiny surface. |
| (3) 10 cc. 0.1% $Na_2Cr_2O_7$; 40 cc. $HNO_3$; 20 cc. HF; 30 cc. Acetic | 0.2 | On Silicon Wafers: Dull rough surface. |
| (4) 5 cc. 0.2% $Na_2Cr_2O_7$; 40 cc. $HNO_3$; 20 cc. HF; 30 cc. Acetic | 2.0 | On Silicon Wafers: Bright shiny, rough surface. |
| (5) 10 cc. 0.4% $Na_2Cr_2O_7$; 25 cc. $HNO_3$; 20 cc. HF | 1.7 | On Silicon Wafers: Rough surface; similar to Solution 21 below. |
| (6) 2 cc. 0.5% $Na_2Cr_2O_7$; 30 cc. $HNO_3$; 20 cc. HF | ------- | On n-p-n Silicon Bars: Very rapid reaction, Mirror surface, uneven. |
| (7) 10 cc. 0.5% $Na_2Cr_2O_7$; 30 cc. $HNO_3$; 20 cc. HF | 6.2 | On Silicon Wafers: Shiny surface. |
| (8) 7 cc. 0.6% $Na_2Cr_2O_7$; 30 cc. $HNO_3$; 20 cc. HF | 7.3 | On Silicon Wafers: Smooth shiny surface. |
| (9) 9 drops 1% $Na_2Cr_2O_7$; 40 cc. $HNO_3$; 24 cc. HF; 24 cc. Acetic | ------- | On n-p-n Germanium Bars: Mirror surface, uneven etch. Slow reaction. Sharp edges and corners. |
| (10) 1 cc. 1% $Na_2Cr_2O_7$; 30 cc. $HNO_3$; 20 cc. HF | 9.0–10.0 | On Silicon Wafers: Mirror surface. On n-p-n Germanium Bars: Shiny, rough surface. One end etched much more than the other. Groove at "P" layer, |

*Table I*—Continued

SODIUM DICHROMATE ETCH SOLUTION

| Composition | Etch Rate (mils/60 sec.) | Comments |
|---|---|---|
| (11)<br>1 cc. 1% $Na_2Cr_2O_7$<br>30 cc. $HNO_3$<br>20 cc. HF<br>30 cc. Acetic | 1.7–2.1 | On Silicon Wafers: Mirror surface, very slightly rough. Corners and edges sharp. On n-p-n Germanium Bars: Mirror surface, smooth, uneven. Groove at "P" layer. About 1 mil/min. etch rate. On n-p-n Silicon Bars: Good definition of emitter. Slight step at "P" layer after 40 seconds. |
| (12)<br>1 cc. 1% $Na_2Cr_2O_7$<br>30 cc. $HNO_3$<br>20 cc. HF<br>40 cc. Acetic | 0.7 | On Silicon Wafers: Mirror surface, slightly uneven corners and edges sharp. On n-p-n Germanium Bars: Mirror surface, smooth, uneven. No "P" layer groove. About 1 mil/min. |
| (13)<br>1 cc. 1% $Na_2Cr_2O_7$<br>40 cc. $HNO_3$<br>20 cc. HF<br>10 cc. Acetic | -------- | On n-p-n Germanium Bars: Mirror surface, uneven etch. Slow reaction. Groove at "P" layer. |
| (14)<br>1 cc. 1% $Na_2Cr_2O_7$<br>40 cc. $HNO_3$<br>30 cc. HF | -------- | On n-p-n Germanium Bars: Mirror surface, slightly rough. Uneven etch. Groove at "P" layer. About 2 mil/min. |
| (15)<br>1 cc. 1% $Na_2Cr_2O_7$<br>40 cc. $HNO_3$<br>30 cc. HF<br>5 cc. Acetic | -------- | On n-p-n Germanium Bars: Mirror surface, uneven etch. Groove at "P" layer. |
| (16)<br>1 cc. 1% $Na_2Cr_2O_7$<br>40 cc. $HNO_3$<br>20 cc. HF<br>30 cc. Acetic | 2.0–2.8 | On Silicon Wafers: Mirror sursurface, slightly rough. On n-p-n Germanium Bars: Mirror surface, rough. Slow reaction. On n-p-n Silicon Bars: Good definition after 40 seconds. Definite step at "P" layer. |
| (17)<br>4 cc. 1% $Na_2Cr_2O_7$<br>25 cc. $HNO_3$<br>20 cc. HF | 8.7 | On Silicon Wafers: Mirror surface. |
| (18)<br>10 cc. 1% $Na_2Cr_2O_7$<br>20 cc. $HNO_3$<br>30 cc. HF | -------- | On Silicon Wafers: Rapid reaction. After 3 minutes, mirror surface. Some "horns." |
| (19)<br>20 cc. 1% $Na_2Cr_2O_7$<br>20 cc. $HNO_3$<br>30 cc. HF | -------- | On Silicon Wafers: Rapid reaction at first (about like CP-6) then slowed. After 10 minutes surface rough. |
| (20)<br>20 cc. 2.5% $Na_2Cr_2O_7$<br>20 cc. $HNO_3$<br>30 cc. HF | -------- | On Silicon Wafers: Rapid reaction. After 2½ minutes surface mottled, uneven. |
| (21)<br>15 cc. 3.3% $Na_2Cr_2O_7$<br>20 cc. $HNO_3$<br>30 cc. HF | 4.0–5.0 | On Silicon Wafers: After 3 minutes surface very rough. Wafers brittle; jagged edges and corners. |
| (22)<br>1 cc. 10% $Na_2Cr_2O_7$<br>40 cc. $HNO_3$<br>30 cc. HF | 1.5–1.75 | On n-p-n Germanium Bars: Mirror surface, slightly rough, uneven etch. Groove at "P" layer. |
| (23)<br>5 cc. 10% $Na_2Cr_2O_7$<br>20 cc. $HNO_3$<br>30 cc. HF | -------- | On Silicon Wafers: Extremely fast. 12 mil wafer almost completely dissolved after 60 seconds. |
| (24)<br>1 cc. 1% $Na_2Cr_2O_7$<br>30 cc. $HNO_3$<br>20 cc. HF<br>5 cc. Acetic | 7.0–7.5 | On Silicon Wafers: Mirror surface. Very good second etch for silicon transistors and germanium transistors. |

What is claimed is:

1. A method of etching a surface of an electrical semiconductor which comprises etching said surface in a solution of nitric acid, hydrofluoric acid, and sodium dichromate.

2. A method as claimed in claim 1 in which the etching solution has added thereto acetic acid.

3. A method as claimed in claim 1 in which the electrical semiconductor is germanium.

4. A method as claimed in claim 1 in which the electrical semiconductor is silicon.

5. A method as claimed in claim 2 in which the etching is conducted for a period of about 25 seconds and the etching solution then washed from said surface.

6. An etching solution for etching the surface of an electrical semiconductor which comprises a solution of nitric acid, hydrofluoric acid, and sodium dichromate in the proportion of about 30 to about 50 parts by volume of concentrated nitric acid, about 20 to 30 parts by volume of 48% hydrofluoric acid, and about 0.5 to about 21 parts by volume of 0.05 to 10% aqueous sodium dichromate solution.

7. An etching solution as claimed in claim 6 in which acetic acid is added thereto.

8. An etching solution as claimed in claim 7 in which said acetic acid is added in the proportion of about 5 to 40 parts by volume.

9. An etching solution for etching the surface of electrical semiconductors which comprises a solution of 30 parts by volume of concentrated nitric acid, 20 parts by volume of 48% hydrofluoric acid, and 1 part by volume of 1% aqueous sodium dichromate.

10. An etching solution for etching the surface of electrical semiconductors which comprises a solution of 30 parts by volume of concentrated nitric acid, 20 parts by volume of 48% hydrofluoric acid, 5 parts by volume of glacial acetic acid and 1 part by volume of 1% aqueous sodium dichromate.

11. An etching solution for etching the surface of electrical semiconductors which comprises a solution of 30 parts by volume of concentrated nitric acid, 20 parts by volume of 48% hydrofluoric acid, 30 parts by volume of glacial acetic acid and 1 part by volume of 1% aqueous sodium dichromate.

12. A method of etching a silicon surface of an electrical semiconductor which comprises etching said surface in a solution of nitric acid, hydrofluoric acid, acetic acid and sodium dichromate.

References Cited in the file of this patent

UNITED STATES PATENTS

| | | |
|---|---|---|
| 2,619,414 | Heidenreich | Nov. 25, 1952 |
| 2,656,496 | Sparks | Oct. 20, 1953 |
| 2,740,700 | Fuller | Apr. 3, 1956 |
| 2,760,890 | Kosmos | Aug. 28, 1956 |